(12) United States Patent
Wu

(10) Patent No.: US 8,199,930 B2
(45) Date of Patent: Jun. 12, 2012

(54) POP NOISE SUPPRESSION APPARATUS AND AUDIO OUTPUT SYSTEM UTILIZING THE SAME

(75) Inventor: Shih-Chien Wu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 688 days.

(21) Appl. No.: 12/345,516

(22) Filed: Dec. 29, 2008

(65) Prior Publication Data
US 2009/0208032 A1 Aug. 20, 2009

(30) Foreign Application Priority Data
Feb. 15, 2008 (TW) .............................. 97105413 A

(51) Int. Cl.
*H04B 15/00* (2006.01)
(52) U.S. Cl. ..................... 381/94.5; 381/94.1; 381/94.4; 381/94.8; 381/123
(58) Field of Classification Search ................. 381/94.1, 381/94.4, 94.8, 123
See application file for complete search history.

(56) References Cited

U.S. PATENT DOCUMENTS

| 4,371,841 | A | 2/1983 | Eckert et al. |
| 7,378,904 | B2 * | 5/2008 | Risbo ............................... 330/10 |
| 2008/0144857 | A1 * | 6/2008 | Huang et al. .................. 381/94.5 |

FOREIGN PATENT DOCUMENTS

| JP | 57062605 | 4/1982 |
| TW | I275312 B | 3/2007 |
| TW | 200806068 A | 1/2008 |

* cited by examiner

*Primary Examiner* — Wai Sing Louie
(74) *Attorney, Agent, or Firm* — Altis Law Group, Inc.

(57) ABSTRACT

A pop noise suppression apparatus for eliminating popping noise generated upon initiation or shutdown of an audio output circuit comprises a switch component and a control circuit. The switch component allows the audio output circuit to provide audio through the output of the audio output circuit. The control circuit provides a mute signal for a first period of time in to response initiation or shutdown of the audio circuit. The control circuit comprises a capacitor to be charged upon initiation of the audio output circuit or to be discharged upon shutdown of the audio output circuit. A length of the first period of time during which the mute signal is provided depends on a second period of time to charge or discharge the capacitor.

1 Claim, 3 Drawing Sheets

POP NOISE SUPPRESSION APPARATUS AND AUDIO OUTPUT SYSTEM UTILIZING THE SAME

BACKGROUND

1. Technical Field

The present disclosure relates to an audio output system, and more particularly to a pop noise suppression apparatus of an audio output system.

2. Description of Related Art

High-class audio output systems usually utilize dual power systems with positive and negative voltage power supplies for shaping amplitude characteristics appropriate to audio receiving terminals. However, general audio output systems may utilize single power systems in consideration of product manufacturing cost. Because an amplifier with a single power system is prone to generate direct current (DC) bias voltage in output audio waveforms, an audio output system may need a coupling capacitor to eliminate the DC bias signal. Given this, any rising or falling DC signal generated upon system initiation or shutdown, however, produces a loud annoying popping noise. As a result, external volume control during audio output system initiation or shutdown may be necessary.

DETAILED DESCRIPTION

Figure 1:
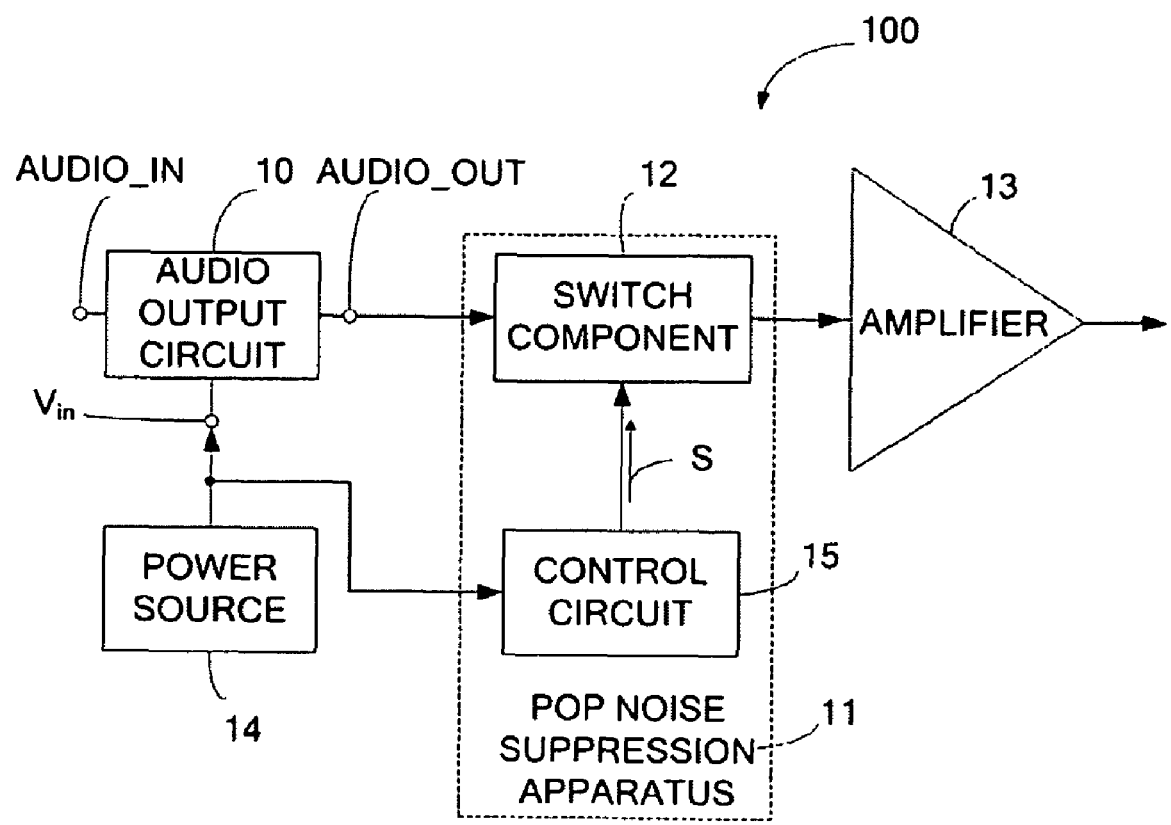
FIG. 1 is a schematic diagram of an embodiment of an audio output system.

With reference to FIG. 1, one embodiment of an audio output system 100 comprises an audio output circuit 10, a pop noise suppression apparatus 11, an amplifier 13 and a power source 14. The audio output circuit 10 receives power signals from a $V_{in}$ terminal, receives audio signals from an AUDIO_IN terminal and provides audio signals through an AUDIO_OUT terminal.

The pop noise suppression apparatus 11 comprises a switch component 12 and a control circuit 15. The control circuit 15 is utilized to provide a mute signal S to control the switch component 12. The switch component 12 is connected to the AUDIO_OUT terminal of the audio output circuit 10. The switch component 12 may prevent the audio output circuit 10 from providing audio signals to a specific external circuit, such as the amplifier 13 in FIG. 1, due to a short circuit or an open circuit. The switch component 12 allows the audio output circuit 10 to provide audio signals through the AUDIO_OUT terminal when the mute signal S is not received, and prevents the audio output circuit 10 from providing audio output signals through the AUDIO_OUT terminal upon receiving the mute signal S. The control circuit 15 may detect whether the power source 14 supplies electrical power to the audio output circuit 10, and based on the detection accordingly temporarily provide the mute signal S to prevent the audio output circuit 10 from generating popping noise upon initiation or shutdown.

The switch component 12 may be implemented by various switch components, such as a transistor, a phototransistor, a relay, or a metal-oxide-semiconductor field-effect transistor (MOSFET).

The amplifier 13 may be a power amplifier or any other amplifier. The amplifier 13 and the audio output circuit 10 may be configured as two separate apparatuses or integrated as one apparatus.

The power source 14 is connected to the audio output circuit 10 and the control circuit 15 of the pop noise suppression apparatus 11. In this embodiment, the power source 14 is configured to provide direct current to the control circuit 15, which may be a power supply that provides direct current, alternating current, or both. Thus, the control circuit 15 may detect and respond to a variation of power signals provided to the audio output circuit 10, and provide the mute signal S for a predetermined period of time. For example, power signals provided to the audio output circuit 10 may vary from one voltage level corresponding to a shutdown state of the audio output circuit 10 to another voltage level corresponding to a initiation state, or vary from a first voltage level corresponding to a working state of the audio output circuit 10 to a second voltage level corresponding to a shutdown state.

Figure 2:
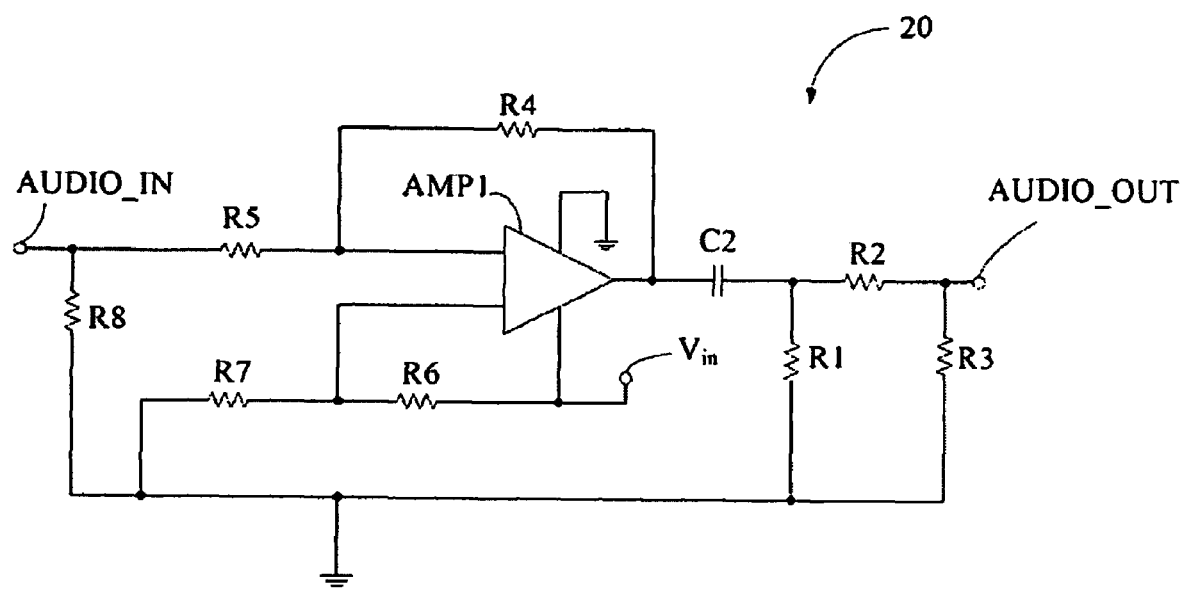
FIG. 2 is a schematic diagram of an embodiment of an audio output circuit.

FIG. 2 illustrates an audio output circuit 20. The audio output circuit 20 is one embodiment of the audio output circuit 10. It should be understood that the audio output circuit 20 is not limited to the form illustrated in FIG. 2, and the audio output circuit 20 may comprise various electronic components in different connections. In this exemplary embodiment, the audio output circuit 20 comprises an operation amplifier AMP1 and a plurality of resistors R1-R8 as illustrated in FIG. 2. One end of the operation amplifier AMP1 is coupled to the AUDIO_IN terminal that may be connected to a radio-wave receiver, a storage media reader or any other apparatus for receiving audio signals from external signals or storage media. Another input terminal of the AMP1 is coupled to the $V_{in}$ terminal and is utilized to receive power signals from the power source 14. An output terminal of the operation amplifier AMP1 is connected to a capacitor C2 and is subsequently coupled to the AUDIO_OUT terminal through the capacitor C2.

In one example, the power source 14 may be a single power system that provides positive voltage or negative voltage. When the power source 14 provides power signals to the audio output circuit 20 for initiation, a rapid voltage variation at the input terminal of the operation amplifier AMP1 causes a rapid signal variation on the output terminal of the operation amplifier AMP1. The generated signal variation goes to the AUDIO_OUT terminal through the capacitor C2 and generates a so-called popping noise. Such situations also happen when the power source 14 stops providing power signals to the audio output circuit 20 and causes the audio output circuit 20 to shut down.

The control circuit 15 detects whether the power source 14 provides electrical power to the audio output circuit 20, and controls the switch component 12 to eliminate the popping noise upon initiation or shutdown of the audio output circuit 20.

Figure 3:
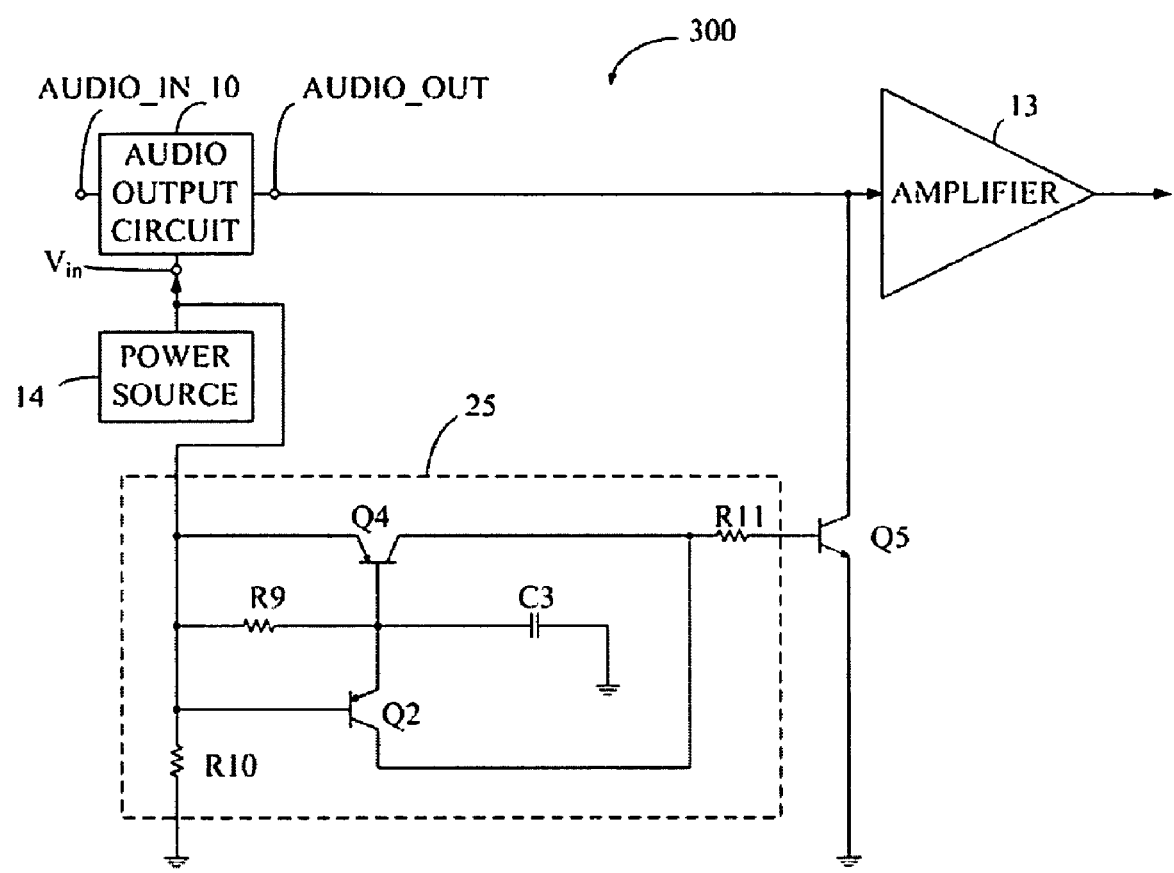
FIG. 3 is a schematic diagram of an embodiment of an audio output system with a pop noise suppression apparatus.

FIG. 3 illustrates one embodiment of an audio output system 300. An NPN transistor Q5 is an exemplary embodiment of the switch component 12, and a control circuit 25 is an exemplary embodiment of the control circuit 15 of FIG. 1. A collector of the transistor Q5 is connected to the AUDIO_OUT terminal of the audio output circuit 10 and an emitter of the transistor Q5 is grounded. A signal with a voltage level provided by the control circuit 25 to a base of the transistor Q5 is utilized as the mute signal S to turn on the transistor Q5 when the voltage level exceeds a cut-in voltage of the transistor Q5. Thus, audio signals provided by the audio output circuit 10 are grounded when the transistor Q5 receives the mute signal S.

The control circuit 25 comprises a capacitor C3. A resistor R9 is connected the power source 14. One end of the capacitor C3 is connected to the power source 14 through the resistor R9 and the other end grounded. Resistance of a resistor R10 is greater than that of the resistor R9. For example, resistance of the resistor R10 and R9 may be respectively 47 kilo-ohms and 4.7 kilo-ohms in one embodiment.

In the exemplary embodiment, transistors Q2 and Q4 are PNP transistors. A base of the transistor Q4 is connected between the resistor R9 and the capacitor C3, an emitter is connected to the power source 14 and a collector is coupled to the base of the transistor Q5 through a resistor R11. The power source 14 grounds through the resistor R10. Resistance of the resistor R10 is greater than resistance of the resistor R9 to cause the power source 14 to provide current to the capacitor C3 before the capacitor C3 is fully charged. As the voltage $V_{EB}$ of the emitter to the base of the transistor Q4 is greater than a cut-in voltage, the transistor Q4 is turned on. When the capacitor C3 is fully charged, the power source 14 provides current through the resistor R10, the voltage $V_{EB}$ of the transistor Q4 becomes smaller than the cut-in voltage, and the transistor Q4 is turned off.

A base of the transistor Q2 is coupled between the power source 14 and the resistor R10. An emitter of the transistor Q2 is connected between the transistor R9 and the capacitor C3, a collector is connected to the base of the transistor Q5 through resistor R11. When the power source continues to provide current to the capacitor C3, a voltage $V_{EB}$ of the emitter to the base of the transistor Q2 becomes smaller than a cut-in voltage, and the transistor Q2 is accordingly turned off. When the power source 14 stops providing current to the capacitor C3, the capacitor C3 starts discharging, the voltage $V_{EB}$ of the emitter to the base of the transistor Q2 is greater than the cut-in voltage, and the transistor Q2 is turned on. After discharging of the capacitor C3 proceeds for a period of time, the voltage $V_{EB}$ of the transistor Q2 becomes smaller than the cut-in voltage, and the transistor Q2 is turned off.

The control circuit 25 causes the power source 14 to charge the capacitor C3 upon initiation of the audio output circuit 10 and to discharge the capacitor C3 upon shut down of the audio output circuit 10. The transistor Q4 and Q2 are turned on respectively during charging and discharging of the capacitor C3 to provide the mute signal S to the transistor Q5. Thus, the control circuit 25 can respond to initiation and shutdown of the audio output circuit 10 by providing the mute signal S during a first period of time after initiation of the audio output circuit 10 and during a second period of time after shutdown of the audio output circuit 10. A length of the first period of time depends on a third period of time required to charge the capacitor C3, and a length of the second period of time depends on a fourth period of time required to discharge the capacitor C3.

The present disclosure utilizes transistor and capacitor characteristics to turn on a transistor during power-on or power-off of a power source, thus eliminating popping noise during initiation or shutdown of a single power system. A computer simulation of the described circuits shows that popping noise can be lowered from 6V to 400 mV in one exemplary embodiment. The present disclosure can improve product quality and save costs of having both a negative and a positive voltage power supply.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio output system utilizing a pop noise suppression apparatus for eliminating popping noise generated upon initiation of an audio output circuit, wherein the pop noise suppression apparatus comprising:

a switch component connected to an output terminal of an audio output circuit to allow the audio output circuit to provide audio through the output terminal and to prevent the audio output circuit from providing audio through the output terminal in response to receiving a mute signal, wherein the switch component is a first transistor, a collector of the first transistor is connected to the output terminal of the audio output circuit, and an emitter of the first transistor is grounded; and a control circuit providing the mute signal for a first period of time in response to initiation of the audio output circuit and a third period of time in response to shutdown of the audio output circuit, the control circuit comprising:

a capacitor arranged such that the capacitor is charged upon initiation of the audio output circuit, wherein a length of the first period of time depends on a second period of time required to charge the capacitor, and is discharged upon shutdown of the audio output circuit, wherein the length of the third period of time depends on a fourth period of time required to discharge the capacitor;

a first resistor connected to a power source of the audio output circuit, wherein the capacitor is coupled to the power source of the audio output circuit through the first resistor;

a second transistor having a base connected to the first resistor and the capacitor, and an emitter and a collector respectively connected to the power source of the audio output circuit and a base of the first transistor;

a second resistor, wherein the power source of the audio output circuit is grounded through the second resistor, and a resistance of the second resistor is greater than a resistance of the first resistor; and a third transistor having a base coupled to the power source and the second resistor, an emitter connected to the first resistor and the capacitor, and a collector connected to a base of the first transistor.

* * * * *